(12) United States Patent
Frankel et al.

(10) Patent No.: US 8,582,705 B2
(45) Date of Patent: Nov. 12, 2013

(54) SERIALIZER-DESERIALIZER CIRCUIT WITH MULTI-FORMAT AND MULTI-DATA RATE CAPABILITY

(75) Inventors: Michael Y. Frankel, Baltimore, MD (US); John P. Mateosky, West River, MD (US); Stephen B. Alexander, Annapolis, MD (US)

(73) Assignee: Ciena Corporation, Hanover, MD (US)

( * ) Notice: Subject to any disclaimer, the term of this patent is extended or adjusted under 35 U.S.C. 154(b) by 1382 days.

(21) Appl. No.: 11/953,305

(22) Filed: Dec. 10, 2007

(65) Prior Publication Data

US 2009/0147896 A1 Jun. 11, 2009

(51) Int. Cl.
*H04L 7/00* (2006.01)

(52) U.S. Cl.
USPC ........... 375/354; 327/141; 370/503; 709/248; 713/375; 714/12

(58) Field of Classification Search
None
See application file for complete search history.

(56) References Cited

U.S. PATENT DOCUMENTS

| | | | |
|---|---|---|---|
| 6,473,449 B1 * | 10/2002 | Cafarella et al. | 375/141 |
| 7,123,678 B2 * | 10/2006 | Hendrickson | 375/376 |
| 7,380,993 B2 * | 6/2008 | Dallesasse | 385/89 |
| 7,570,643 B2 * | 8/2009 | Prasad et al. | 370/392 |
| 7,751,726 B1 * | 7/2010 | Gazzola et al. | 398/202 |
| 7,941,053 B2 * | 5/2011 | Dallesasse | 398/139 |
| 2004/0028164 A1 * | 2/2004 | Jiang et al. | 375/371 |
| 2004/0177291 A1 * | 9/2004 | Goyal et al. | 714/712 |
| 2005/0192772 A1 * | 9/2005 | Pepper | 702/122 |
| 2006/0034358 A1 * | 2/2006 | Okamura | 375/219 |
| 2006/0193399 A1 * | 8/2006 | Katagiri et al. | 375/308 |
| 2007/0065157 A1 * | 3/2007 | Katagiri et al. | 398/155 |
| 2007/0080702 A1 * | 4/2007 | Fishman et al. | 324/765 |
| 2008/0037594 A1 * | 2/2008 | Hornbuckle et al. | 370/537 |
| 2009/0022492 A1 * | 1/2009 | Brownlee et al. | 398/43 |
| 2009/0074407 A1 * | 3/2009 | Hornbuckle et al. | 398/43 |
| 2011/0081872 A1 * | 4/2011 | Bar-Sade et al. | 455/77 |

* cited by examiner

*Primary Examiner* — Shuwang Liu
*Assistant Examiner* — Gina McKie
(74) *Attorney, Agent, or Firm* — Clements Bernard PLLC; Christopher L. Bernard; Lawrence A. Baratta, Jr.

(57) ABSTRACT

The present invention provides a serializer/deserializer (SERDES) circuit that can cover both client- and network-side interfaces for high-speed data rates. The present invention leverages commonality between the client and network (also known as line) side, and accommodates differences in a flexible manner. In one exemplary embodiment, the present invention provides a four-channel implementation to meet the requirement of both interfaces. The SERDES circuit can be capable of supporting both 40 Gb/s and 56 Gb/s data rates, can include an integrated DQPSK pre-coder and I/Q input/output signals, and can support RZ clock recovery. Additionally, the SERDES circuit can include differential coding support, electronic pre-emphasis, receiver-side electronic dispersion compensation, and the like.

16 Claims, 7 Drawing Sheets

SERIALIZER-DESERIALIZER CIRCUIT WITH MULTI-FORMAT AND MULTI-DATA RATE CAPABILITY

FIELD OF THE INVENTION

The present invention relates generally to electronic serializer/deserializer (SERDES) circuits for high-speed networking, and more particularly, to a SERDES circuit that covers both client and network-side interfaces capable of supporting both 40 Gb/s and 56 Gb/s data rates, and includes an integrated DQPSK pre-coder and I/Q input/output signals.

BACKGROUND OF THE INVENTION

Current communication standards are well settled for protocols such as 10 Gb/s Ethernet, 10 Gb/s SONET/SDH, and 40 Gb/s SONET/SDH. However, continuing rapid growth in network bandwidth requirements is pushing standards bodies, such as the Institute of Electrical and Electronics Engineers (IEEE) and International Telecommunication Union-Telecommunication (ITU-T), to start considering higher data rates. For example, recent standards activity has been focused on developing a 100 Gb/s Ethernet protocol.

As protocols move beyond 10 Gb/s and 40 Gb/s, network bandwidth requirements are starting to outstrip the capability of serial electronics and optics. Accordingly, network equipment is moving towards parallel configurations for delivering these higher data rates. This is a phenomenon similar to the current state of microprocessor central processing units (CPUs), where the CPU clock speed has been roughly constant for approximately the past five years, while at the same time CPU architecture has shifted to multi-core approaches to meet increasing computational demands.

Similarly, current 100 Gb/s Ethernet proposals for client-side interface interconnects are concentrated on some combination of parallel configurations. For example, combinations including 10×10 Gb/s, 5×20 Gb/s, and 4×25 Gb/s are under consideration. Similarly, network-side wavelength division multiplexed (WDM) interfaces above 40 Gb/s are quite difficult to realize in a fully serial fashion due to limitations associated with conventional optics and electronics. Accordingly, it is advantageous to implement network-side interfaces with reduced requirements on the electronics and optics bandwidth. It would be further advantageous to leverage the same or largely similar electronic components for both client-side and network line-side interfaces. Advantageously, Non-Recurring Engineering (NRE) costs could decrease, while part production volumes could increase accordingly.

Specifically, one of the critical system components in high-speed communication systems is an electronic serializer/deserializer (SERDES) circuit. SERDES circuits generally provide multiplexing (serializing) and de-multiplexing (de-serializing) of data signals to allow electronics to process high-speed data signals at a lower rate. The serializer (SER) part provides a low-speed parallel interface to the electronics, and multiplexes the data signals to output a drive signal to an optical interface. The deserializer (DES) part accepts signals from the optical interface, recovers the signal clock and data, and provides re-timed and parallel-de-multiplexed data to subsequent electronics.

Conventionally, what exists today are SERDES circuits that recover non-return-to-zero (NRZ) format incoming data, provide dual input/output (I/O) channels (such as for I and Q channels in Differential Quadrature Phase Shift Keying (DQPSK)), provide selectable rates between non-forward error correction (FEC) client rates of ~20 Gb/s and FEC-encoded line rates of ~22 Gb/s (i.e., total throughput of 40 Gb/s data, 44 Gb/s including FEC overhead), and provide standards-compliant SERDES Framer Interface Level 5 (SFI-5). SFI-5 is defined in OIF-SFI5-01.02, "Serdes Framer Interface Level 5 (SFI-5): Implementation Agreement for 40 Gb/s Interface for Physical Layer Devices" from the Optical Internetworking Forum (OIF), and the contents of which are incorporated in full by reference herein. Note, the SFI-5 standards specify maximum throughput rate of 50 Gb/s.

High-speed data signals are moving towards Return-to-Zero (RZ) formats for transmission. For example, DQPSK modulation format can be utilized with RZ optical pulses. Disadvantageously, conventional SERDES do not exist with functionality to recover clocks from RZ pulses. Additionally, 100 Gb/s data rates require a maximum throughput in excess of 50 Gb/s (the current maximum throughput of SFI-5). Thus, there exists a need for an overclocked SFI-5 interface to support rates in excess of 50 Gb/s as is required with framing and FEC for a 100 Gb/s signal. Further, conventional SERDES lack functionality required for high-speed data rates, such as differential coding support (e.g., DQPSK precoding), electronic pre-emphasis, receiver-side electronic dispersion compensation, and the like.

Thus, there exists a need for a SERDES circuit which can be extended to cover the requirements of both client and network-side interfaces in emerging high-speed (e.g., 100 Gb/s) communication networks.

BRIEF SUMMARY OF THE INVENTION

In various exemplary embodiments, the present invention provides a SERDES circuit that can cover both client- and network-side interfaces. The present invention leverages commonality between the client and network (also known as line) side, and accommodates differences in a flexible manner. In one exemplary embodiment, the present invention provides a four-channel implementation to meet the requirement of both interfaces. For example, the SERDES circuit is capable of supporting both 40 Gb/s and 56 Gb/s data rates, and includes an integrated DQPSK pre-coder and I/Q input/output signals.

In an exemplary embodiment of the present invention, a serializer/deserializer (SERDES) circuit includes input/output ports utilizing SERDES Framer Interface Level 5 (SFI-5); a clock and data recovery circuit configured to recover a clock from a Return-to-Zero input; and a clock multiplier unit. The clock and data recovery circuit includes one of a low-pass filter and a rectifier for recovering the clock from the Return-to-Zero input, and the clock and data recovery further includes multiple voltage-controlled oscillator (VCO) bands for clock and data recovery. The input/output ports are configured to provide a standard SFI-5 and an overclocked SFI-5, wherein the input/output ports are configured to provide rates including an SFI-5 rate of 39.813 Gb/s with 16 data lanes at 2.48832 Gb/s each, an SFI-5 rate of 40.00 Gb/s with 16 data lanes at 2.500 Gb/s each, an SFI-5 rate of 43.0184 Gb/s with 16 data lanes at 2.6887 Gb/s each, an SFI-5 rate for 44.5709 Gb/s with 16 data lanes at 2.7857 Gb/s each, an SFI-5 rate of 53.5461 Gb/s with 16 data lanes at 3.347 Gb/s each, and an SFI-5 rate of 56.1899 Gb/s with 16 data lanes at 3.512 Gb/s each. Optionally, the SERDES circuit further includes circuitry configured to provide selectable differential coding. One or more of the input/output ports connect to a differential quadrature phase shift keying (DQPSK) modulator. The circuitry can include a DQPSK precoder circuit configured to precode an input data stream to provide an I and Q data stream output for DQPSK modulation. The DQPSK precoder is configured to precode raw data $d_i$ and $g_i$ into precoded outputs $I_i$ and $Q_i$ according to the formulas:

$$I_i = \overline{(Q_{i-1} \otimes I_{i-1}) \cdot (d_i \otimes I_{i-1})} + (Q_{i-1} \otimes I_{i-1}) \cdot \overline{(g_i \otimes I_{i-1})}$$
$$Q_i = \overline{(Q_{i-1} \otimes I_{i-1}) \cdot (g_i \otimes I_{i-1})} + (Q_{i-1} \otimes I_{i-1}) \cdot (d_i \otimes I_{i-1})$$

wherein $d_i$ and $g_i$ are uncoded raw data inputs, $I_i$ and $Q_i$ are precoded outputs to drive the DQPSK modulator; and subscript i-1 denotes a one-bit delayed signal. The formulas are implemented with a plurality of exclusive OR gates, inverter gates, AND gates, OR gates, one-bit delays, and combinations thereof. Alternatively, the SERDES circuit further includes circuitry configured to provide electronic pre-emphasis, and circuitry configured to provide receiver-side electronic distortion compensation.

In another exemplary embodiment of the present invention, a serializer/deserializer (SERDES) circuit with multi-format and multi-data rate capability, includes input/output ports utilizing SWEDES Framer Interface Level 5 (SFI-5), wherein the SFI-5 includes one of a standard SFI-5 and an overclocked SFI-5; a clock and data recovery circuit configured to recover a clock from a Return-to-Zero input, wherein the clock and data recovery circuit includes one of a low-pass filter and a rectifier for recovering the clock from the Return-to-Zero input; and a clock multiplier unit; wherein the input/output ports are configured to provide rates including an SFI-5 rate of 39.813 Gb/s with 16 data lanes at 2.48832 Gb/s each, an SFI-5 rate of 40.00 Gb/s with 16 data lanes at 2.500 Gb/s each, an SFI-5 rate of 43.0184 Gb/s with 16 data lanes at 2.6887 Gb/s each, an SFI-5 rate for 44.5709 Gb/s with 16 data lanes at 2.7857 Gb/s each, an SFI-5 rate of 53.5461 Gb/s with 16 data lanes at 3.347 Gb/s each, and an SFI-5 rate of 56.1899 Gb/s with 16 data lanes at 3.512 Gb/s each. Optionally, the SERDES circuit further includes circuitry configured to provide electronic pre-emphasis, and circuitry configured to provide receiver-side electronic distortion compensation.

In yet another exemplary embodiment of the present invention, a serializer/deserializer (SERDES) circuit including a differential quadrature phase shift keying (DQPSK) precoder includes input/output ports utilizing SERDES Framer Interface Level 5 (SFI-5), wherein the input/output ports are configured to provide a standard SFI-5 and an overclocked SFI-5; a clock and data recovery circuit configured to recover a clock from a Return-to-Zero input, wherein the clock and data recovery circuit includes one of a low-pass filter and a rectifier for recovering the clock from the Return-to-Zero input; a clock multiplier unit; and a DQPSK precoder configured to precode an input data stream to provide an I and Q data stream output for DQPSK modulation, wherein the DQPSK precoder is selectably enabled; wherein one or more of the input/output interfaces connect to a differential quadrature phase shift keying (DQPSK) modulator. Optionally, the input/output ports are configured to provide rates including an SFI-5 rate of 39.813 Gb/s with 16 data lanes at 2.48832 Gb/s each, an SFI-5 rate of 40.00 Gb/s with 16 data lanes at 2.500 Gb/s each, an SFI-5 rate of 43.0184 Gb/s with 16 data lanes at 2.6887 Gb/s each, an SFI-5 rate for 44.5709 Gb/s with 16 data lanes at 2.7857 Gb/s each, an SFI-5 rate of 53.5461 Gb/s with 16 data lanes at 3.347 Gb/s each, and an SFI-5 rate of 56.1899 Gb/s with 16 data lanes at 3.512 Gb/s each. The DQPSK precoder is configured to precode raw data $d_i$ and $g_i$ into precoded outputs $I_i$ and $Q_i$ according to the formulas:

$$I_i = \overline{(Q_{i-1} \otimes I_{i-1}) \cdot (d_i \otimes I_{i-1})} + (Q_{i-1} \otimes I_{i-1}) \cdot \overline{(g_i \otimes I_{i-1})}$$
$$Q_i = \overline{(Q_{i-1} \otimes I_{i-1}) \cdot (g_i \otimes I_{i-1})} + (Q_{i-1} \otimes I_{i-1}) \cdot (d_i \otimes I_{i-1})$$

wherein $d_i$ and $g_i$ are uncoded raw data inputs, $I_i$ and $Q_i$ are precoded outputs to drive the DQPSK modulator; and subscript i-1 denotes a one-bit delayed signal. The formulas are implemented with a plurality of exclusive OR gates, inverter gates, AND gates, OR gates, one-bit delays, and combinations thereof. Optionally, the SERDES circuit further includes circuitry configured to provide electronic pre-emphasis and circuitry configured to provide receiver-side electronic distortion compensation.

BRIEF DESCRIPTION OF THE DRAWINGS

The present invention is illustrated and described herein with reference to the various drawings, in which like reference numbers denote like system components, respectively, and in which:

FIG. 3*b* assuming an electrical receiver filter with 3 dB cutoff bandwidth half of signal Baud rate; and FIG. 3*c* assuming a rectified electrical signal;

DETAILED DESCRIPTION OF THE INVENTION

In various exemplary embodiments, the present invention provides a SERDES circuit that can cover both client- and network-side interfaces for high-speed data rates.

The present invention leverages commonality between the client and network (also known as line) side, and accommodates differences in a flexible manner. In one exemplary embodiment, the present invention provides a four-channel implementation to meet the requirement of both interfaces. The SERDES circuit can be capable of supporting both 40 Gb/s and 56 Gb/s data rates, can include an integrated DQPSK pre-coder and I/Q input/output signals, and can support RZ clock recovery. Additionally, the SERDES circuit can include differential coding support, electronic pre-emphasis, receiver-side electronic dispersion compensation, and the like.

Figure 1:
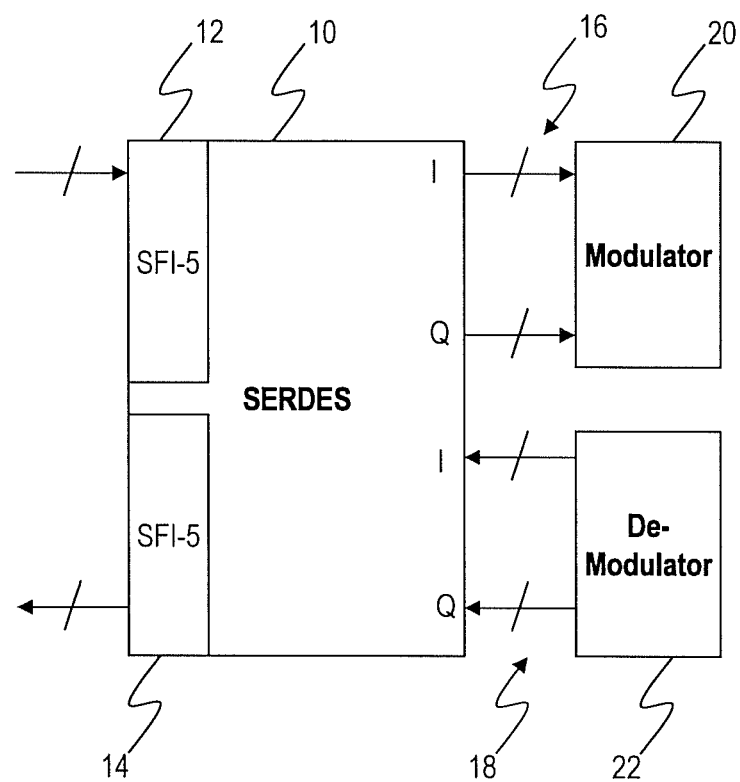
FIG. 1 is a block diagram of a SERDES circuit according to an exemplary embodiment of the present invention.

Referring to FIG. 1, a SERDES 10 is illustrated according to an exemplary embodiment of the present invention. The SERDES 10 module includes four input/output (I/O). For example, the SERDES 10 can include variable-rate SFI-5 12,14 interfaces to client-side electronics and I/Q interfaces 16,18 to line-side electronics. The client-side electronics can include framing circuitry (e.g., Optical Transport Network (OTN)) or the like, and the line-side electronics can include a modulator 20 and de-modulator 22 for optical transmission.

In this exemplary embodiment, the SERDES 10 is illustrated interfacing the modulator 20 and de-modulator 22 which are configured for DQPSK. Alternatively, the same SERDES 10 could be utilized to interface a client side or the like. The SERDES 10 can be created by combining two modules, co-packaging two modules, or fabricating a single module on a single die. The SERDES 10 can be an integrated circuit (also known as IC, microcircuit, microchip, silicon chip, or chip). The SERDES 10 module is integrated into a client and line-side interface, such as a circuit pack.

The SERDES 10 module can selectively lock to 25 Gb/s data as is appropriate for the client-side interfaces, and to approximately 27-28 Gb/s for the network-side data including FEC overhead. Generally, the interfaces 12,14,16,18 include parallel data interfaces, such as 16 lanes with a 17$^{th}$ framing channel lane. The SFI-5 12,14 interfaces can be compliant to the Optical Internetworking Forum (OIF) standard OIF-SF15-01.0. In a standard SFI-5 implementation, each data lane supports 3.125 Gb/s for a total of 16×3.125 Gb/s=50 Gb/s.

The standard SFI-5 interface only supports up to 50 Gb/s. However, 100 Gb/s data signals require more than 50 Gb/s due to FEC and framing overhead. Additionally, the SERDES 10 can include an ability to support an over-clocked SFI-5 interface, in addition to the standard one. The SERDES 10 includes multiple voltage-controlled oscillator (VCO) bands for clock and data recovery (CDR) on the receiver or de-multiplexer side, and a clock multiplier unit (CMU) on the transmit or multiplexer side. The CDR and CMU are configured to support various rates on the data interfaces.

Advantageously, with the ability to support rate agility on data interfaces, the SERDES 10 can easily support a variety of client and line rates and signal types. Also, this flexibility enables the SERDES 10 to support a plethora of FEC-encoded overhead architectures (e.g., 7%, 15%, 25% overhead, etc.) as well as standard and proprietary, non-FEC encoded signals/systems. The maximum throughput rate could be 56 Gb/s if two separate interfaces are used, or 112 Gb/s if a single interface is used (i.e., 16 lanes at approximately 7 Gb/s each, which is within the capability of current electronics).

For example, the SERDES 10 can provide varying SFI-5 rates, such as:

SFI-5 rate for 39.813 Gb/s: 16 data lanes at 2.48832 Gb/s each. The rate represents an un-coded OC-768 client rate;

SFI-5 rate for 40.00 Gb/s: 16 data lanes at 2.500 Gb/s each. This rate represents a typical future 40 GbE standard rate (non-FEC encoded) client;

SFI-5 rate for 43.0184 Gb/s: 16 data lanes at 2.6887 Gb/s each. The exact derivation of this rate is as follows: 9.95328G*4*[255/236], this is a standard G.709, OTU3 rate derivation;

SFI-5 rate for 44.5709 Gb/s: 16 data lanes at 2.7857 Gb/s each. The exact derivation of this rate is as follows: 10.3125*4*[255/236];

SFI-5 rate for 53.5461 Gb/s: 16 data lanes at 3.347 Gb/s each. The exact derivation of this rate is as follows: 9.95328G*10*[255/237]/2; and SFI-5 rate of 56.1899 Gb/s: 16 data lanes at 3.512 Gb/s each. The exact derivation of this rate is as follows: 103.125G*[255/234]/2.

The SERDES 10 module is further configured to provide selectable digital coding for the output to the line-side interfaces, such as the I/Q interfaces 16,18. For example, the SERDES 10 can provide Differential Phase Shift Keying (DPSK) differential coding or DQPSK differential coding. Also, the digital coding can be set to no digital coding, such as for a client-side interface. Advantageously, integration of digital coding into the SERDES 10 module further reduces part counts in high-speed optical transceiver modules.

Additionally, the SERDES 10 module is configured with the ability to add electronic pre-emphasis to support either reduced bandwidth connections or reduced bandwidth optical transmission parts, and the ability to implement receiver-side electronic distortion compensation on each channel, again to either improve support of board-level interconnects or to improve optical channel performance.

Figure 2:
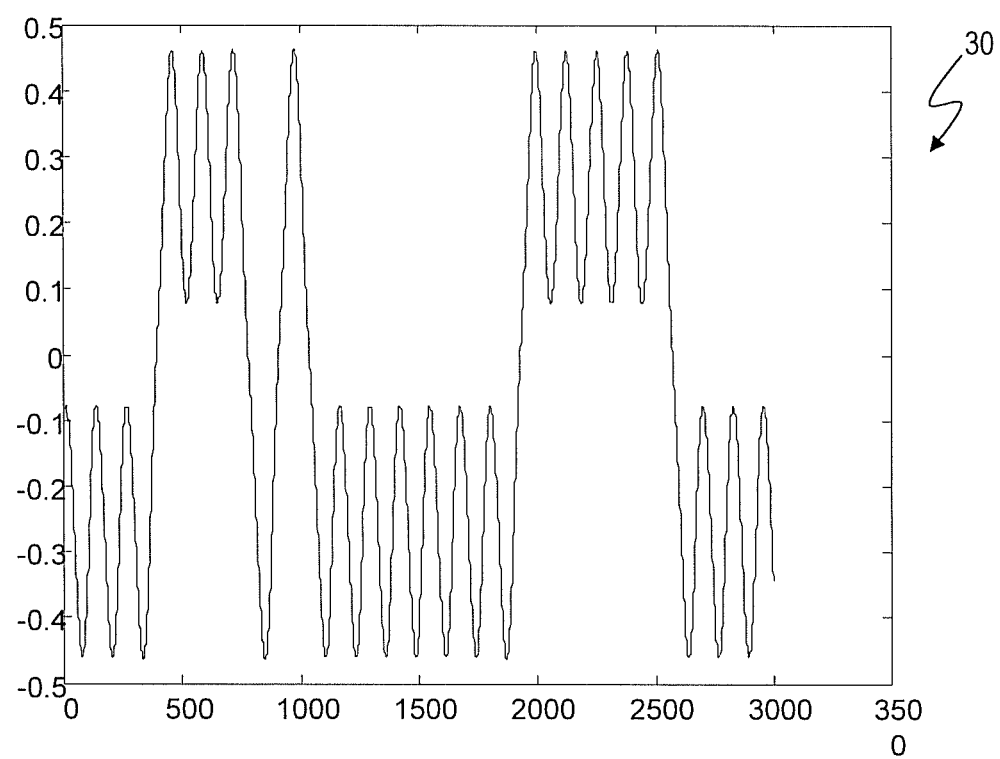
FIG. 2 is a graph illustrating an example of a Return-to-Zero (RZ)-like electrical signal.

The SERDES 10 also includes a clock recovery circuit. The SERDES 10 is configured to recover a clock from Return-to-Zero (RZ)-like electrical signals, such as received from either DPSK or DQPSK demodulators. Referring to FIG. 2, an example RZ-like electrical signal 30 is illustrated. The electrical demodulated signals have a form of +RZ pulses for "1" state, and −RZ pulses for "0" state, with a return to zero level in the inter-pulse time slots. SERDES circuits typically implement Non-Return-to-Zero (NRZ) clock recovery, and can use an exclusive-OR (XOR)-based mechanism to reconstruct the clock tone. However, such mechanisms do not work directly for the RZ-like signal 30.

Figure 3A:
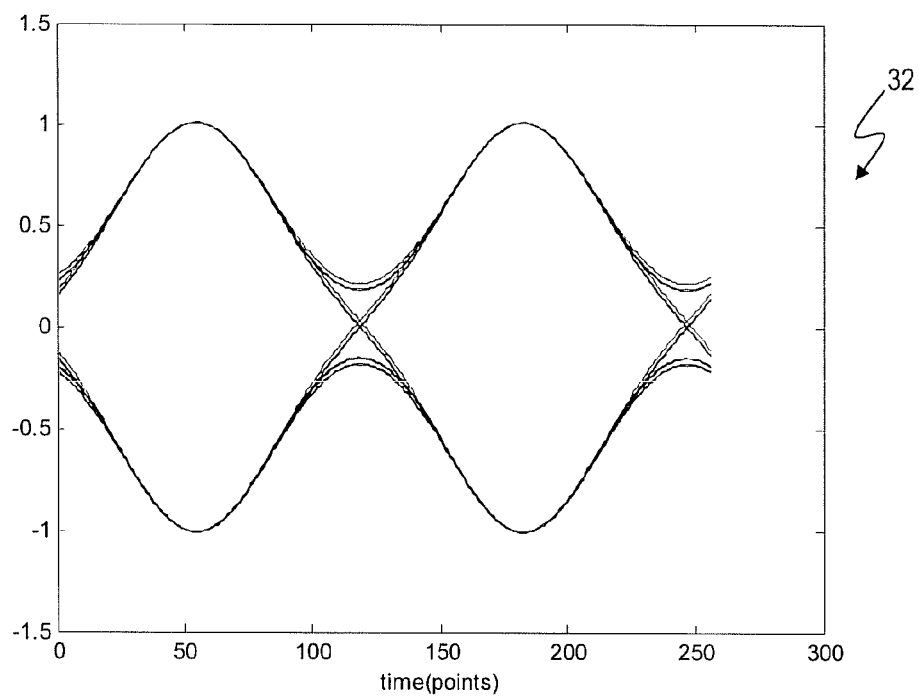
FIGS. 3*a*, 3*b*, and 3*c* are graphs illustrating a recovered Eye diagram from the RZ-like signal in FIG. 2 with FIG. 3*a* assuming an electrical receiver filter with 3 dB cutoff bandwidth same as signal Baud rate.
Figure 3B:
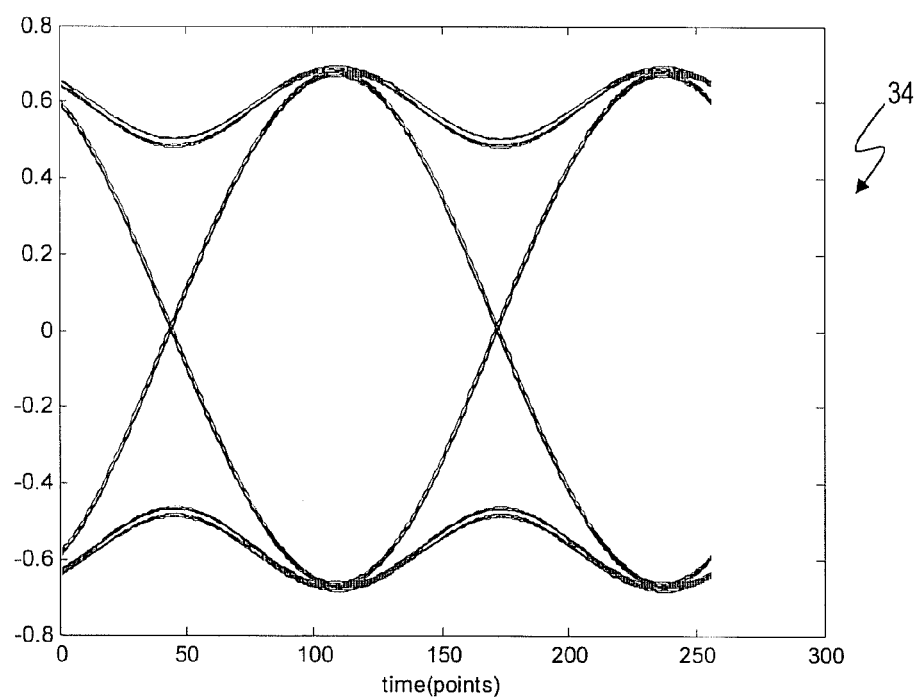
Figure 3C:
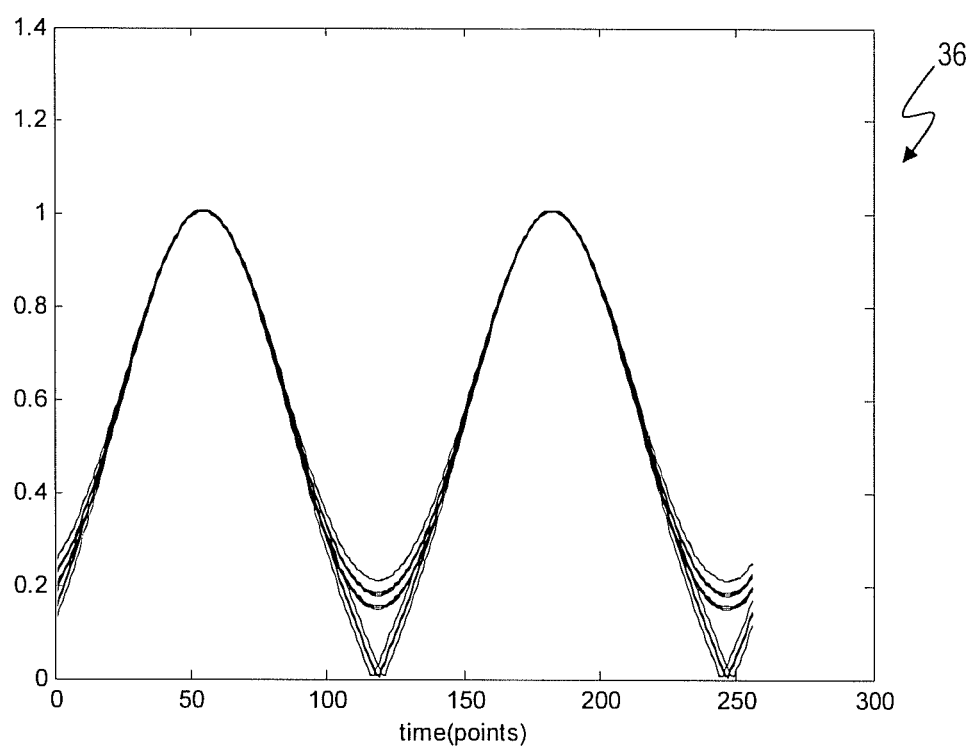

Referring to FIGS. 3a, 3b, and 3c, graphs 30,32,34 are depicted illustrating a recovered Eye diagram from the RZ-like signal in FIG. 2 with FIG. 3a assuming an electrical receiver filter with 3 dB cutoff bandwidth same as signal Baud rate; FIG. 3b assuming an electrical receiver filter with 3 dB cutoff bandwidth half of signal Baud rate; and FIG. 3c assuming a rectified electrical signal, according to an exemplary embodiment of the present invention.

FIG. 3a shows a typical RZ-like signal entering the SERDES 10. The clock recovery circuit in the SERDES 10 is configured with a low-pass filter to convert the RZ-like signals to NRZ for clock recovery, such as shown in FIG. 3b. Alternatively, the SERDES 10 can provide a rectifier for providing a strongly regenerated clock tone, such as shown in FIG. 3c. Advantageously, the SERDES 10 includes additional clock recovery functionality enabling high-speed RZ-signals.

Figure 4:
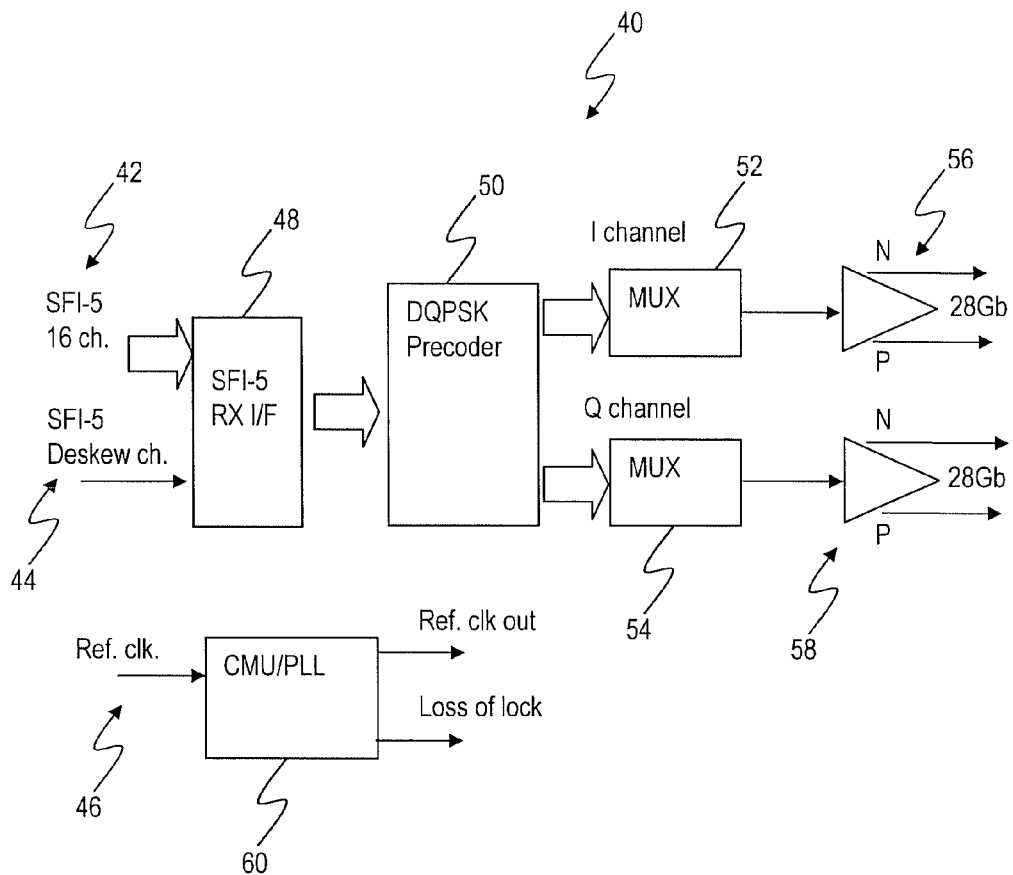
FIG. 4 is a block diagram illustrating a 56 Gb/s multiplexer for DQPSK, according to an exemplary embodiment of the present invention.

Referring to FIG. 4, a physical (PHY) block diagram illustrates a 56 Gb/s multiplexer 40 for DQPSK, according to an exemplary embodiment of the present invention. The multiplexer 40 illustrates the functional components associated with providing a DQPSK line-side interface with the SERDES. The multiplexer 40 receives a 16 Ch. SFI-5 input 42, an SFI-5 deskew ch. 44, and a reference clock 46. The 16 Ch. SFI-5 input 42 and an SFI-5 deskew ch. 44 are input into an SFI-5 receiver (RX) interface 48. The RX interface 48 includes circuitry to receive the SFI-5 inputs 42,44 and to provide them to a DQPSK precoder 50.

The DQPSK precoder 50 is configured to precode a single data stream into two data streams (I, Q) for DQPSK modulation. In the SERDES circuit of the present invention, DQPSK precoding is a selectable option. Further, the SERDES circuit can provide no differential coding or DPSK differential coding. The output of the precoder 50 is two parallel data streams each on multiple data lines, such as eight, thirty-two, or the like, and input into multiplexers 52,54. The multiplexers 52,54 are configured to serialize the output of the precoder 50. Alternatively, if precoding is not selected, the multiplexers 52,54 serialize the output of the RX interface 48. The output of the multiplexers 52,54 are connected to modulator drivers 56,58 for DQPSK modulation. Note, the modulator drivers 56,58 can be external to the SERDES circuit.

The reference clock 46 is input into a clock multiplier/phase lock loop (CMU/PLL) circuit 60. The CMU/PLL circuit 60 is configured to receive the reference clock 46 and to provide the clock at a multiplied rate as needed to the various circuits in the multiplexer 40. The CMU/PLL circuit 60 includes a reference clock output and a loss of lock output. For example, the CMU/PLL circuit 60 can be configured to provide a clock application to the various SFI-5 rates described herein, such as 39.813 Gb/s, 40.00 Gb/s, 43.0184 Gb/s, 44.5709 Gb/s, 53.5461 Gb/s, 56.1899 Gb/s, and the like.

The following table illustrates exemplary specifications for the 56 Gb/s multiplexer 40 for DQPSK:

| PARAMETER | Nom. | Unit | Comments/Condition |
|---|---|---|---|
| Data rate (output) | 28.094952 +/− 1% | Gbaud | 1$^{st}$ band, I/Q (for 56.1 Gb/s) |
| Data rate (output) | 26.773063 +/− 1% | Gbaud | 2$^{nd}$ band I/Q (for 53.5 Gb/s) |
| Data rate (output) | 22.285487 +/− 1% | Gbaud | 3rd band I/Q (for 44.6 Gb/s) |

Figure 5:
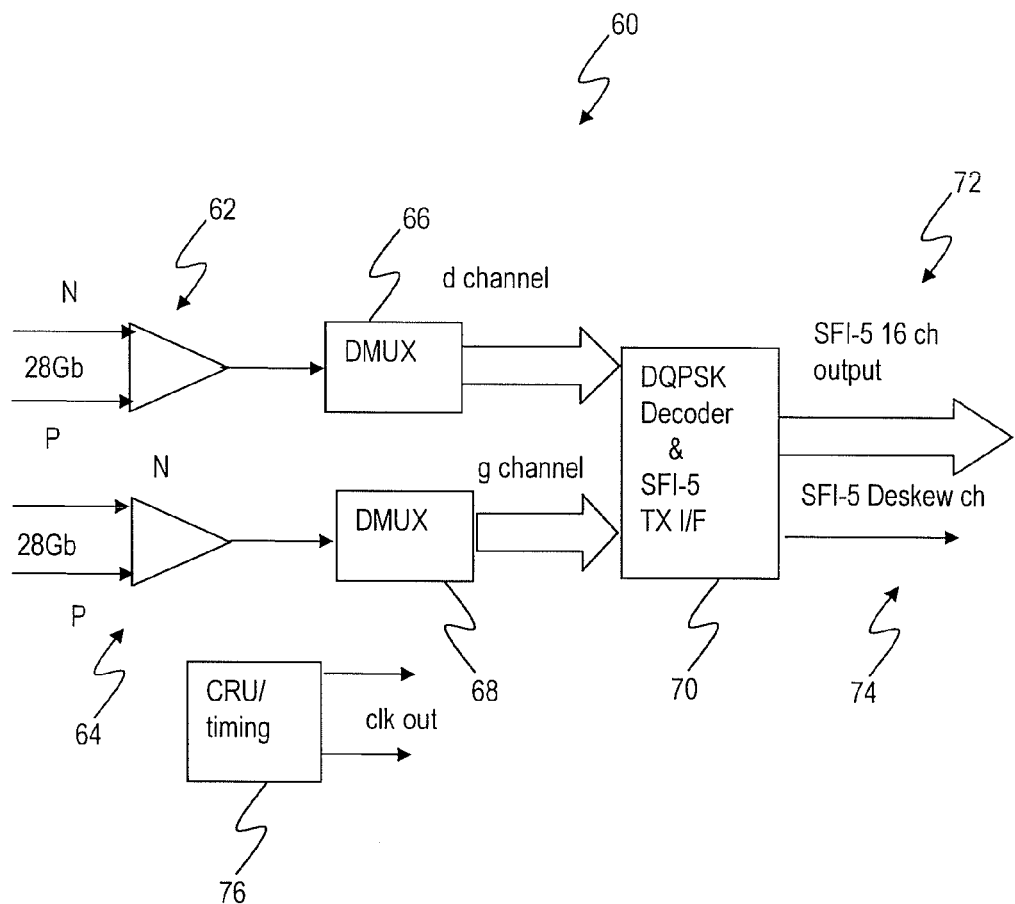
FIG. 5 s a block diagram illustrating a 56 Gb/s de-multiplexer for DQPSK, according to an exemplary embodiment of the present invention.

Referring to FIG. 5, a physical (PHY) block diagram illustrates a 56 Gb/s de-multiplexer 60 for DQPSK, according to an exemplary embodiment of the present invention. The de-multiplexer 60 illustrates the functional components associated with receiving a DQSPK line-side interface with the SERDES. The de-multiplexer 60 receives two data streams from receiver preamplifiers 62,64 and provides each data stream to a de-multiplexer 66,68. Multiple line data paths for the I and Q channel are provided to a decoder into the SFI-5 Transmit interface 70.

The decoder and interface 70 is configured to remultiplex the I and Q channel data streams into a single data stream, and to provide a 16 Ch. SFI output 72 and an SFI-5 deskew ch. 74. Alternatively, decoder and interface 70 can provide a gearbox from I/Q data to SFI-5 in lieu of a decoder.

A clock recovery unit/timing circuit 76 is configured to recover a clock from received data signals. The circuit 76 provides a clock output to the various components in the de-multiplexer 60. The circuit 76 can include multiple voltage-controlled oscillator (VCO) bands for clock and data recovery (CDR), Similar to the CMU/PLL circuit 60, the circuit 76 can be configured to provide a clock application to the various SFI-5 rates described herein, such as 39.813 Gb/s, 40.00 Gb/s, 43.0184 Gb/s, 44.5709 Gb/s, 53.5461 Gb/s, 56.1899 Gb/s, and the like The following table illustrates exemplary specifications for the 56 Gb/s de-multiplexer 60 for DQPSK:

| PARAMETER | Nom. | Unit | Comments/Condition |
|---|---|---|---|
| Data rate (input) | 28.094952 +/− 1% | Gbaud | 1$^{st}$ band, I/Q, (for 56.1 Gb/s) |
| Data rate (input) | 26.773063 +/− 1% | Gbaud | 2$^{nd}$ band I/Q, (for 53.5 Gb/s) |
| Data rate (input) | 22.285487 +/− 1% | Gbaud | 3rd band I/Q (for 44.6 Gb/s) |

Figure 6:
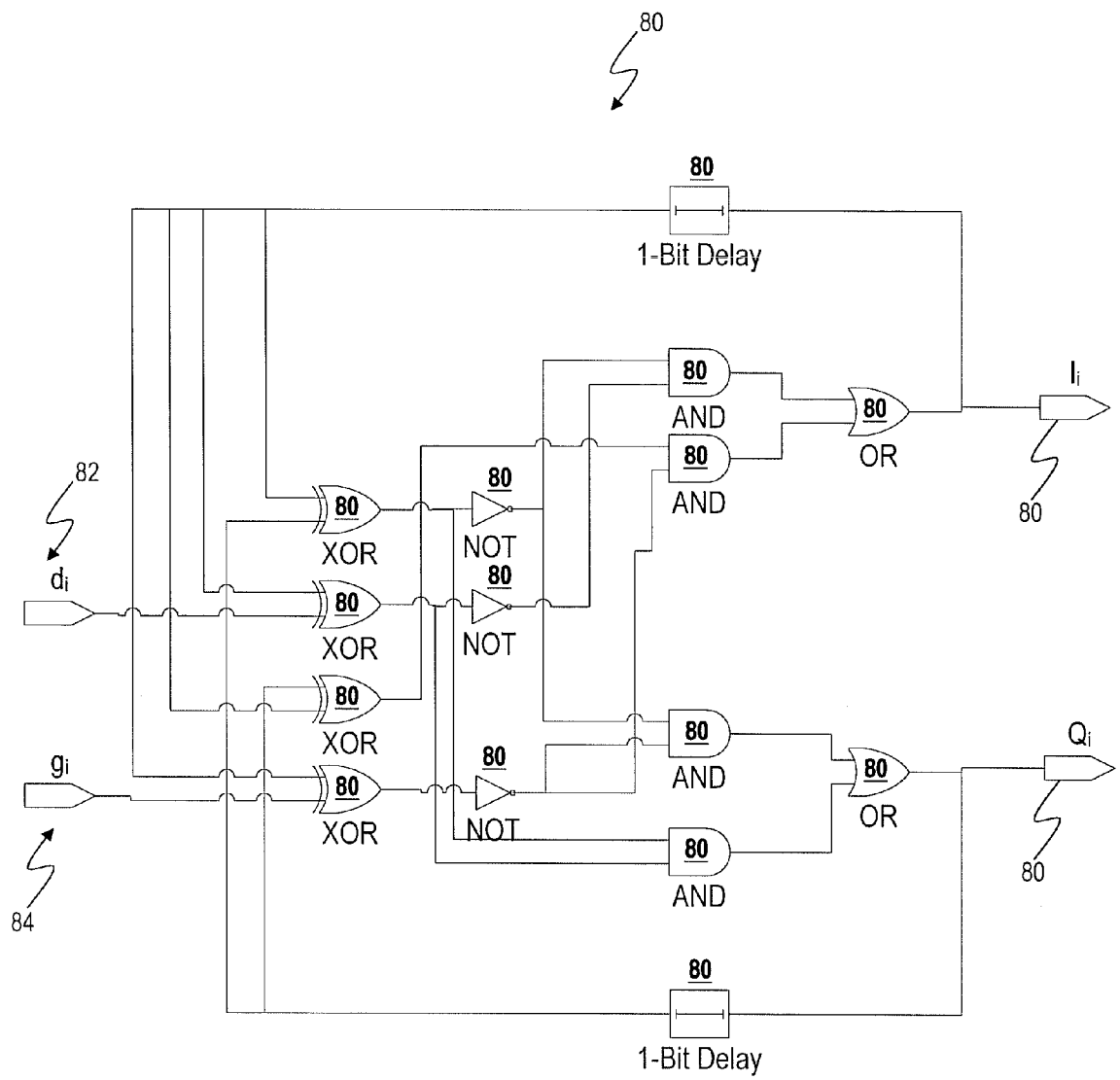
FIG. 6 is a logic diagram illustrating a DQPSK precoder structure according to an exemplary embodiment of the present invention.

Referring to FIG. 6, a DQPSK precoder structure 80 is illustrated according to an exemplary embodiment of the present invention. This structure 80 can be included within the SERDES circuit to provide preceding for line-side DQPSK transmission. The following equations illustrate an exemplary embodiment of the precoder structure 80 for a DQPSK transmitter.

$$I_i = \overline{(Q_{i-1} \otimes I_{i-1}) \cdot (d_i \otimes I_{i-1})} + (Q_{i-1} \otimes I_{i-1}) \cdot \overline{(g_i \otimes I_{i-1})}$$

$$Q_i = \overline{(Q_{i-1} \otimes I_{i-1}) \cdot (g_i \otimes I_{i-1})} + (Q_{i-1} \otimes I_{i-1}) \cdot (d_i \otimes I_{i-1})$$

where $d_i$ and $g_i$ are uncoded raw data inputs, and $I_i$ and $Q_i$ are precoded outputs to drive the optical modulators; subscript i-1 denotes a one-bit delayed signal. It should be noted that the receiver's output signals correspond to the raw data $d_i$ and $g_i$.

Inputs $d_i$ 82 and $g_i$ 84 are each input into an exclusive OR (XOR) gate 86,88 along with one-bit delayed outputs 90,92 from the previous iteration. Also, the one-bit delayed outputs 90,92 are each input into XOR gates 94,96. The output of XOR gate 94 is input into an inverter 98, the output of the XOR gate 86 is input into an inverter 100, ad the output of the XOR gate 88 is input into an inverter 102. The outputs of the inverter 98 and the inverter 100 are input into an AND gate 104. The outputs of XOR gate 96 and the inverter 102 are input into an AND gate 106. The outputs of the inverter 98 and the inverter 102 are input into an AND gate 108. The outputs of the XOR gate 94 and the XOR gate 86 are input into an AND gate 110.

The outputs of the AND gate 104 and the AND gate 106 are input into an OR gate 112. The outputs of the AND gate 108 and the AND gate 110 are input into an OR gate 114. The output of the OR gate 112 is connected to the delayed output 90 for the next iteration, and is connected to an I data output 120. The output of the OR gate 114 is connected to the delayed output 92 for the next iteration, and is connected to an Q data output 122.

The DQPSK precoder structure 80 is included within the SERDES circuit of the present invention in an exemplary embodiment. This enables the SERDES circuit to provide a direct output to a DQPSK modulator without requiring additional circuitry. Also, the SERDES circuit can include ability on the de-multiplexer to swap the $d_i$ and $g_i$ input data streams under software control, such as via a dedicated Low Voltage Complementary Metal Oxide Semiconductor (LVCMOS) input. Additionally, the SERDES circuit can include the ability to squelch the parallel (SFI-5) data output (to a FEC-Framer) under software control via an LVCMOS input/control pin on the de-multiplexer. This is useful under Loss of Modulation scenarios.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A serializer/deserializer (SERDES) circuit, comprising:
input/output ports utilizing SERDES Framer Interface Level 5 (SFI 5);
a clock and data recovery circuit configured to recover a clock from a Return-to-Zero input; and
a clock multiplier unit configured to receive the clock and to provide the clock at a multiplied rate, wherein the clock and data recovery circuit and the clock multiplier unit are communicatively coupled to the input/output ports;
wherein the input/output ports, the clock and data recovery circuit, and the clock multiplier unit are configured to provide a standard SFI-5 and an overclocked SFI-5 based on the multiplied rate, and wherein the overclocking is based on an amount of forward error correction;

wherein the input/output ports, the clock and data recovery circuit, and the clock multiplier unit are configured to provide rates comprising an SFI-5 rate of 39.813 Gb/s with 16 data lanes at 2.48832 Gb/s each, an SFI-5 rate of 40.00 Gb/s with 16 data lanes at 2.500 Gb/s each, an SFI-5 rate of 43.0184 Gb/s with 16 data lanes at 2.6887 Gb/s each, an SFI-5 rate of 44.5709 Gb/s with 16 data lanes at 2.7857 Gb/s each, an overclocked SFI-5 rate of 53.5461 Gb/s with 16 data lanes at 3.347 Gb/s each, and an overclocked SFI-5 rate of 56.1899 Gb/s with 16 data lanes at 3.512 Gb/s each.

2. The SERDES circuit of claim 1, wherein the clock and data recovery circuit comprises one of a low-pass filter and a rectifier for recovering the clock from the Return-to-Zero input.

3. The SERDES circuit of claim 2, wherein the clock and data recovery circuit further comprises multiple voltage-controlled oscillator (VCO) bands for clock and data recovery.

4. The SERDES circuit of claim 1, further comprising circuitry configured to provide selectable differential coding.

5. The SERDES circuit of claim 4, wherein one or more of the input/output ports connect to a differential quadrature phase shift keying (DQPSK) modulator.

6. The SERDES circuit of claim 5, wherein the circuitry comprises a DQPSK precoder circuit configured to precode an input data stream to provide an I and Q data stream output for DQPSK modulation.

7. The SERDES circuit of claim 6, wherein the DQPSK precoder is configured to precode raw data $d_i$ and $g_i$ into precoded outputs $I_i$ and $Q_i$ according to the formulas:

$$I_i = \overline{(Q_{i-1} \otimes I_{i-1}) \cdot (d_i \otimes I_{i-1})} + (Q_{i-1} \otimes I_{i-1}) \cdot \overline{(g_i \otimes I_{i-1})}$$

$$Q_i = \overline{(Q_{i-1} \otimes I_{i-1}) \cdot (g_i \otimes I_{i-1})} + (Q_{i-1} \otimes I_{i-1}) \cdot (d_i \otimes I_{i-1})$$

wherein $d_i$ and $g_i$ are uncoded raw data inputs, $I_i$ and $Q_i$ are precoded outputs to drive the DQPSK modulator; and subscript i-1 denotes a one-bit delayed signal.

8. The SERDES circuit of claim 7, wherein the formulas are implemented with a plurality of exclusive OR gates, inverter gates, AND gates, OR gates, one-bit delays, and combinations thereof.

9. The SERDES circuit of claim 1, further comprising circuitry configured to provide electronic pre-emphasis.

10. The SERDES circuit of claim 1, further comprising circuitry configured to provide receiver-side electronic distortion compensation.

11. A serializer/deserializer (SERDES) circuit with multi-format and multi-data rate capability, comprising:
input/output ports utilizing SERDES Framer Interface Level 5 (SFI 5);
a clock and data recovery circuit configured to recover a clock from a Return-to-Zero input, wherein the clock and data recovery circuit comprises one of a low-pass filter and a rectifier for recovering the clock from the Return-to-Zero input; and
a clock multiplier unit configured to receive the clock and to provide the clock at a multiplied rate, wherein the clock and data recovery circuit and the clock multiplier unit are communicatively coupled to the input/output ports;
wherein the SFI-5 comprises one of a standard SFI-5 and an overclocked SFI-5 based on the multiplied rate, and wherein the overclocking is based on an amount of forward error correction;
wherein the input/output ports, the clock and data recovery circuit, and the clock multiplier unit are configured to provide rates comprising an SFI-5 rate of 39.813 Gb/s with 16 data lanes at 2.48832 Gb/s each, an SFI-5 rate of 40.00Gb/s with 16 data lanes at 2.500 Gb/s each, an SFI-5 rate of 43.0184 Gb/s with 16 data lanes at 2.6887 Gb/s each, an SFI-5 rate of 44.5709 Gb/s with 16 data lanes at 2.7857 Gb/s each, an overclocked SFI-5 rate of 53.5461 Gb/s with 16 data lanes at 3.347 Gb/s each, and an overclocked SFI-5 rate of 56.1899 Gb/s with 16 data lanes at 3.512 Gb/s each.

12. The SERDES circuit of claim 11, further comprising circuitry configured to provide electronic pre-emphasis.

13. The SERDES circuit of claim 11, further comprising circuitry configured to provide receiver-side electronic distortion compensation.

14. A serializer/deserializer (SERDES) circuit including a differential quadrature phase shift keying (DQPSK) precoder, comprising:
input/output ports utilizing SERDES Framer Interface Level 5 (SFI 5);
a clock and data recovery circuit configured to recover a clock from a Return-to-Zero input, wherein the clock and data recovery circuit comprises one of a low-pass filter and a rectifier for recovering the clock from the Return-to-Zero input;
a clock multiplier unit configured to receive the clock and to provide the clock at a multiplied rate, wherein the clock and data recovery circuit and the clock multiplier unit are communicatively coupled to the input/output ports; and
a DQPSK precoder configured to precode an input data stream to provide an I and Q data stream output for DQPSK modulation, wherein the DQPSK precoder is selectively enabled;
wherein the input/output ports, the clock and data recovery circuit, and the clock multiplier unit are configured to provide a standard SFI-5 and an overclocked SFI-5 based on the multiplied rate, and wherein the overclocking is based on an amount of forward error correction;
wherein one or more of the input/output interfaces connect to a differential quadrature phase shift keying (DQPSK) modulator; and
wherein the input/output ports, the clock and data recovery circuit, and the clock multiplier unit are configured to provide rates comprising an SFI-5 rate of 39.813 Gb/s with 16 data lanes at 2.48832 Gb/s each, an SFI-5 rate of 40.00 Gb/s with 16 data lanes at 2.500 Gb/s each, an SFI-5 rate of 43.0184 Gb/s with 16 data lanes at 2.6887 Gb/s each, an SFI-5 rate of 44.5709 Gb/s with 16 data lanes at 2.7857 Gb/s each, an overclocked SFI-5 rate of 53.5461 Gb/s with 16 data lanes at 3.347 Gb/s each, and an overclocked SFI-5 rate of 56.1899 Gb/s with 16 data lanes at 3.512 Gb/s each.

15. The SERDES circuit of claim 14, wherein the DQPSK precoder is configured to precode raw data $d_i$ and $g_i$ into precoded outputs $I_i$ and $Q_i$ according to the formulas:

$$I_i = \overline{(Q_{i-1} \otimes I_{i-1}) \cdot (d_i \otimes I_{i-1})} + (Q_{i-1} \otimes I_{i-1}) \cdot \overline{(g_i \otimes I_{i-1})}$$

-continued
$$Q_i = \overline{(Q_{i-1} \otimes I_{i-1})} \cdot \overline{(g_i \otimes I_{i-1})} + (Q_{i-1} \otimes I_{i-1}) \cdot (d_i \otimes I_{i-1})$$

wherein $d_i$ and $g_i$ are uncoded raw data inputs, $I_i$ and $Q_i$ are precoded outputs to drive the DQPSK modulator; and subscript i-1 denotes a one-bit delayed signal.

16. The SERDES circuit of claim 1, further comprising circuitry configured to provide electronic pre-emphasis and circuitry configured to provide receiver-side electronic distortion compensation.

* * * * *